United States Patent [19]
Mahlein et al.

[11] Patent Number: 4,815,081
[45] Date of Patent: Mar. 21, 1989

[54] ARRANGEMENT FOR CONTROLLING OR REGULATING AN EMISSION WAVELENGTH AND EMITTED POWER OF A SEMICONDUCTOR LASER

[75] Inventors: Hans Mahlein, Unterhaching; Reinhard Maerz; Meinrad Schienle, both of Munich, all of Fed. Rep. of Germany

[73] Assignee: Siemens Aktiengesellschaft, Berlin and Munich, Fed. Rep. of Germany

[21] Appl. No.: 172,234

[22] Filed: Mar. 23, 1988

[30] Foreign Application Priority Data

Mar. 30, 1987 [DE] Fed. Rep. of Germany ....... 3710545

[51] Int. Cl.[4] .............................................. H01S 3/13
[52] U.S. Cl. ....................... 372/32; 358/60; 372/29
[58] Field of Search ....................... 372/32, 19, 43, 20, 372/31, 29; 358/60

[56] References Cited

U.S. PATENT DOCUMENTS

4,672,457 6/1987 Hyatt ................................. 358/60

Primary Examiner—Léon Scott, Jr.
Attorney, Agent, or Firm—Hill, Van Santen, Steadman & Simpson

[57] ABSTRACT

An arrangement for controlling or regulating the emission wavelength and emitted optical power of a semiconductor laser is provided in optically integrated fashion. The optical power of the laser is at least partially supplied to an optical detector device and to a wavelength selective optical filter device. That part of the supplied power which passes through the filter device is conducted to another opto-electrical detector device. As a result of the two diodes, the optical power and the emission wavelength of the laser are simultaneously measured, whereby two control signals for the injection current of the laser are obtained.

32 Claims, 4 Drawing Sheets

ARRANGEMENT FOR CONTROLLING OR REGULATING AN EMISSION WAVELENGTH AND EMITTED POWER OF A SEMICONDUCTOR LASER

BACKGROUND OF THE INVENTION

1. Field of the Invention

The present invention is directed generally to an arrangement for controlling or regulating the emission wavelength and emitted power of a semiconductor laser.

2. Description of the Related Art

Laser diodes which have a stable or regulable emission wavelength or a constant emitted optical power are needed in numerous applications of semiconductor laser diodes. For example, such diodes are used in wavelength-division multiplex applications, and in particular in those having narrow channel spacings, and they are also used in optical frequency-division multiplexing or in optical heterodyne reception.

For transversely and longitudinally monomode laser diodes, examples of which are distributed feedback (DFB) or distributed Bragg reflector (DBR) lasers that are presently available, small shifts in emission wavelength are caused by temperature drift, changes in threshold current, and degradation. Such shifts, for example, result in operational disturbances as a result of their interaction with narrow-band optical filters. Furthermore, such laser diodes vary in their optical output power as the result of aging.

Up until now, stabilization or regulation of the emission wavelength of semiconductor lasers has been successful only when complicated arrangements are used to provide external resonators and extreme temperature stabilization. Such arrangements are not suitable for integrated optical arrangements and are not adequate in their degree of stabilization.

SUMMARY OF THE INVENTION

An object of the present invention is to provide an arrangement which can be executed and manufactured with techniques of integrated optics and with which the emission wavelength and emitted optical power of a semiconductor laser can be simultaneously controlled or regulated.

This and other objects are achieved in an arrangement in which optical power from a laser is at least partially conducted to an opto-electrical detector device and to a wavelength selective optical filter device and that portion of the supplied power which is reflected by or allowed to pass by the filter device is supplied to another opto-electrical detector device.

In the arrangement of the invention, the emitted optical power of the laser and its emission wavelength can be simultaneously measured with two opto-electrical detector means and with a wavelength-selective optical filter means. As a result thereof, two control signals are obtained for the injection current of the semiconductor laser. The arrangement of the invention is particularly suitable for monolithic integration.

The wavelength selective optical filter means preferrably has a transmission curve which has a rise and/or a drop over a defined wavelength region into which the emission wavelength of the semiconductor laser falls. The emission wavelength can be even more precisely stabilized for a steeper rise or drop of the transmission curve in the specific region into which the emission wavelength of the laser falls. This is because for a given slope, a small modification of the emission wavelength of the laser effects a great change in the signal current for one of the opto-electrical detector means. Accordingly, an arrangement having a steep rise and/or drop in the transmission curve over the defined wavelength region into which the emission wavelength falls is advantageously employed for stabilizing the emission wavelength of the laser.

It is particularly expedient that the transmission curve of the optical filter means have a peak in the defined wavelength range, particularly when the peak corresponds to an at least relative transmission maximum. Optically precise stabilization of the wavelength can be achieved with such peaks, whereby the emission wavelength of the laser diode to be stabilized lies at the peak or on one of its two flanks. An arrangement in accordance with the invention having a rise and/or drop over the defined wavelength region is used for varying the frequency of the emission wavelength of the semiconductor laser as well. This is especially useful for optical frequency-division multiplex or heterodyne reception applications. In such case, a flatter rise and/or drop of the transmission curve in the defined region into which the emission wavelength falls is more favorable since a greater tuning range is thereby achieved. The size of the tuning range is then determined by the tuning characteristic of the laser. For purposes of the present disclosure, the rise and/or drop of the transmission curve is also referred to as the change in the transmission curve or the slope of the transmission curve.

The filter means of the present arrangement can be composed of a single optical filter element, or alternately can be composed of two or more individual optical filter elements arranged successivly in a propagation direction of the supplied laser power. The arrangement of two or more individual optical filter elements arranged successively in the propagation direction of the supplied optical power is particularly suitable for realizing specific filter characteristics.

Bragg gratings, co-directional directional couplers or contra-directional directional couplers or interference filters are suitable as filter elements in the present invention. Bragg gratings and co-directional and contra-directional directional couplers are suitable for an integrated format of the present arrangement. Interfernce filters, on the other hand, come into consideration for use in hybrid structures of the arrangement. Gratings which have varying grating constants or gratings which have chirp are also of interest for use in realizing specific filter characteristics. The size of the aforementioned tuning range is influenced by the length of the grating. The tuning range is greater the shorter the grating. A larger tuning range can also be achieved by a grating having chirp.

An advantageous realization of an arrangement where the transmission curve of the filter means has a peak transmission maximum and which enables extremely precise stabilization of the emission wavelength is provided by a filter device having two Bragg gratings successively arranged in a propagation direction of the optical power supplied thereto. The Bragg gratings are arranged spaced by a distance from one another which distance amounts to half the wavelength of the supplied power or to a whole multiple of the half wavelength.

The tuning range of an arrangement of the invention is increased by providing a plurality of filter means connected in parallel so that the power of the laser is supplied thereto in parallel. Each such filter device has a respective different detector device allocated to it. A portion of the power reflected by or passed through each filter device is conducted to the corresponding detector device. A specific development of this arrangement proceeds from providing the filter devices having different transmission curves with rising or falling edges at different wavelength regions which follow one another in a direction of increasing wavelength. Such different wavelength regions preferably are adjacent to one another or overlap one another.

Particularly for arrangements having Bragg gratings and an integrated construction, it is expedient to arrange and fashion one of the detector means as a partially transmissive element so that part of the power conducted to this element is passed through one or more filter devices.

An inventive arrangement is preferably formed with the laser emitting laser energy from two sides thereof with part of the power emitted from one side being taken as the output power and part of the power emitted from the other side being conducted to the present arrangement. To avoid reactions of the optical power reflected at the filter means on the laser, it is expedient that a partially transmissive detector device be provided which absorbs more than 95% of the power supplied to it. Provided the partially transmissive detector device absorbs approximately 97% of the optical power, the optical power reflected back and reacting with the laser is attenuated by more than 30 dB. One partially reflecting detector means is preferably in the form of a photodiode. The desired absorbtion of such diode is selectable through its geometry, as well as through its composition and doping of an absorbing layer in the diode.

Where a partially transmissive detector device is provided, it is preferred that the other detector devices or at least one of the other detector devices are formed transmissively as well. Output power from the laser diode is thus taken from the other transmitting detector device. The work is thereby preferably carried out in a transmission maximum of the filter means. For example, the emission wavelength of the laser is stabilized in the aforementioned transmission maximum peak and the detector devices should exhibit an optimally high transmission. Such an arrangement is arranged at the side of the laser at which output power is taken, in contrast to the previously described embodiment.

When optical power is supplied to the filter devices and to the detector devices conducted through one or more optical waveguides, then such an arrangement is suitable for monolithic integration. This is particularly true when the arrangement is formed with the semiconductor laser, the filter devices, the detector devices in the form of photodiodes, and the optical waveguide in the form of strip waveguides all integrated on a common substrate. The filter devices or filter elements are preferably Bragg gratings or co-directional or contradirectional directional couplers and are, as such, particularly suitable for integration.

An advantageous improvement of the arrangement of the invention, and particularly an arrangement provided on a common substrate, is characterized by a branching waveguide. Optical power from the laser is transmitted in one branch of the branching waveguide, and another branch of the waveguide carries laser energy to be supplied to a receiver detector device with a preceeding filtering device. The second waveguide branch carries a wavelength differing from the emission wavelength of the laser. The filtering device preceeding the receiver detector device permits the different wavelength to pass but blocks the emission wavelength of the laser diode. This forms a bi-directional wavelength multiplex-demultiplex arrangement which is monolithically integrable, particularly when the branched waveguide is composed of a strip waveguide fork. The filter element preceding the receiver detector means can be of the same type as the filter device or the filter devices of the arrangement for controlling or regulating the emission wavelength and emitted optical power of the laser. For example, the filter device preceding the receiver detector means, just like the other filter devices, can be a Bragg grating whose grating constant is selected such that a detuning between the transmission curves of the two filter devices by half a stop band width derives. A regulating circuit then tunes the emission wavelength of the laser to the center of the stop band of the Bragg grating preceeding the receiver detector means. The temperature drifts of the two Bragg gratings compensate one another when their spacial distance from the laser is selected to be substantially the same. Modifications in the emission wavelength of the laser which are caused by aging are likewise leveled or reduced.

An expedient development of the arrangement of the invention includes a control circuit for regulating the output power and the emission wavelength of the laser, wherein an output signal of one of the detector devices is used to control or regulate the emitted power of the laser. The output signals of the one as well as the other detector devices are conducted to an amplifier. The output signal of the amplifier is proportional to a quotient of the supplied output signals and is used to control the emission wavelength of the laser. In particular, the control arrangement is also suitable for use in an arrangement having a branched waveguide to tune the emission wavelength of the laser to the center of the stop band of the filter device preceding the receiver detector means provided therein.

A preferred embodiment of the arrangement includes an improvement of the control circuit having a variable voltage divider device connected between one of the detector devices and the amplifier. In this embodiment, the operating point of the laser, and thus its emission wavelength as well, can be varied. This embodiment is beneficial particularly for the case where the tuning range is to be frequency varied over a greater tuning range.

In addition to the described tuning, a simple rough tuning can also be realized in an arrangement including a control circuit in which an inverter is connectable between at least one detector device and the amplifier. A flank of the transmission curve of the appertaining filter device is changed and, as a result thereof, the emission wavelength is varied by the spacing of the two flanks of the transmission curve by the interposition of the inverter between the other detector device or at least one of the other detector devices and the amplifier.

It should be especially mentioned that an arrangement of the invention, and in particular the embodiments having optical waveguides, is realizable with techniques of integrated optics on III-V semiconductors. This means that both the optical arrangement alone, as well as an electrical part such as a control circuit in accordance with one of the later described embodiments can be monolithically integrated on a common III-V semiconductor substrate.

DESCRIPTION OF THE PREFERRED EMBODIMENTS

Figure 1:
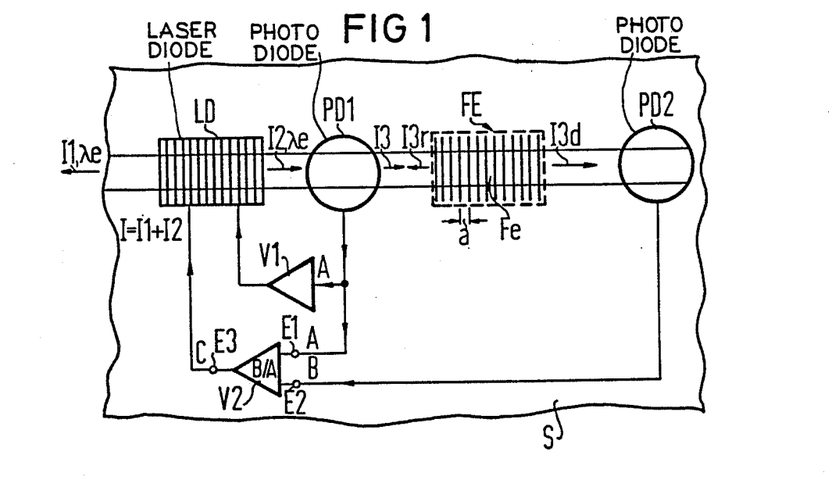
FIG. 1 is a plan view of an arrangement according to the principles of the present invention including a schematic representation of a control circuit.

Referring first to FIG. 1, an arrangement is shown including a semiconductor laser LD in the form of a laser diode, partially opto-electrical detector device PD1 in the form of a photodiode, a filter device FE composed of a filter element Fe in the form of a Bragg grating, and a second opto-electrical detector device PD2 in the form of a photodiode. Each of the elements are connected to one another by a common strip waveguide WL. The strip waveguide WL is formed on a substrate S of III-V semiconductor material on which the entire arrangement, including the electrical parts of the arrangement forming a control circuit, is integrated.

The semiconductor laser LD emits output power I toward both sides. A portion I2 of the output power I, which is emitted to the right relative to FIG. 1, is partially absorbed by the partially transmissive first detector device PD1. An electrical output signal from the first detector device PD1 is used, through an amplifier V1, for power stabilization of the semiconductor laser LD. A first part I1 of the output power I of the semiconductor laser LD is emitted to the left relative to FIG. 1. Both the part I1 and the part I2 of the laser output power I are at a emission wavelength $\lambda e$.

A third part I3 which is part of the supplied optical power I2 which has passed through the partially transmissive first detector device PD1 proceeds to the filter device FE and is partially reflected and partially transmitted thereby. A part I3d of the optical power I3 which has passed through the filter device FE is detected by the second detector device PD2. The second detector device PD2 produces an electrical output signal B which is supplied to an input E2 of a amplifier V2. The electrical output signal A of the first detector device PD1 is conducted not only to the first amplifier V1 but also to another input E1 of the amplifier V2.

At an output E3, the amplifier V2 produces an electrical output signal C which is proportional to the quotient B/A of the two signals B and A at the inputs E2 and E1, respectively, of the amplifier V2. The electrical output signal C is used to monitor and regulate the emission wavelength $\lambda e$ of the semiconductor laser LD. In FIG. 1, the Bragg grating Fe has a grating spacing a. A part of the power I3 directed toward the Bragg grating Fe is reflected as power I3r.

Figure 2:
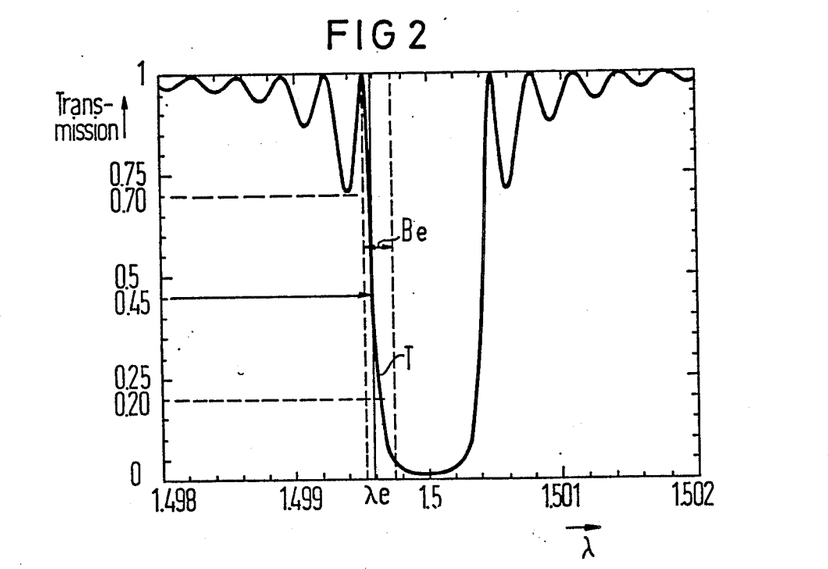
FIG. 2 is a graph of a transmission curve of a filter device from the arrangement of FIG. 1.

With reference now to FIG. 2, an example of a spectral transmission curve T of the filter device FE fashioned as a Bragg grating filter element Fe is shown. The transmission curve T has a drop over a wavelength region Be, in other words, the transmission characteristic of the filter device FE decreases over the range Be as the wavelength increases. In particular, the transmission curve T goes from approximately 1 at the left hand limit of the region Be down to nearly zero at the right hand limit of the region Be. The region Be simultaneously serves as the left hand limit of a stop region of the filter device FE.

The semiconductor laser LD and the filter device FE are selected so that the desired emission wavelength $\lambda e$ of the laser LD falls into the region Be of the transmission curve T, as indicated on the graph of FIG. 2. The wavelength $\lambda e$ is expediently selected so that it falls at a point of especially great steepness, or slope, in the transmission curve T. In FIG. 2, the emission wavelength $\lambda e$ crosses the transmission curve T at approximately 0.45. Due to the great slope of the transmission curve T at the desired emission wavelength $\lambda e$ of the laser LD, a small change in the emission wavelength $\lambda e$ effects a great change in the current in the detector device PD2.

As a consequence of the great steepness of the drop of the transmission curve T in FIG. 2, regulation of the emission wavelength $\lambda e$ to 0.07 nm in the region Be is possible in a range of control of 0.1 nm. For example, for the transmission curve T, the change in the transmission characteristic is from 0.7 to 0.2 over a wavelength interval of 0.06 nm. When it is assumed that operating point of the control loop can be stabilized to one percent, then a stabilization of $10^{-3}$ can be achieved with respect to the wavelength of the Bragg grating Fe. The absolute position of the emission wavelength $\lambda e$ is determined by the temperature drift of the Bragg wavelength of the grating Fe which is caused by the temperature dependency of both the refractive indices as well as the grating constant a.

Although these mechanisms are also responsible for the temperature drift of specific lasers, for example DFB and DBR laser diodes, it is to be expected that they can be significantly more easily governed in purely passive components, since the active zone of the laser is subject to greater temperature fluctuations and its refractive index is also dependent upon the pump condition of the laser. For example, the DFB laser has a tuning range of approximately 0.2 nm, as disclosed by Dutta et al. (see Applied Physics Letters, 48 (1986), page 1501) or the DBR laser having a tuning range of 4 nm as disclosed by Yamaguchi et al. (see Electronics Letters, 21 (1985), page 63). These lasers are suitable as tunable semiconductor lasers LD.

When a conventional DFB or DBR laser is used as the semiconductor laser LD, then the two electrical terminals of the diode are combined in a single terminal.

To avoid reactions of the reflected power I3r reflected from the Bragg grating element Fe onto the laser LD, the detector device PD1 must absorb approximately 97% of the power present in the strip waveguide WL so that optical power reflected onto the laser diode LD is attenuated by more than 30 dB. To achieve a desirable result, an absorption of at least approximately 95% should be provided for the detector device PD1. As already mentioned, the desired absorption of the partially transmissive detector device PD1 formed as a photodiode is selectable by the geometry of the diode, as well as the composition and doping of its absorbing layer.

Figure 3:
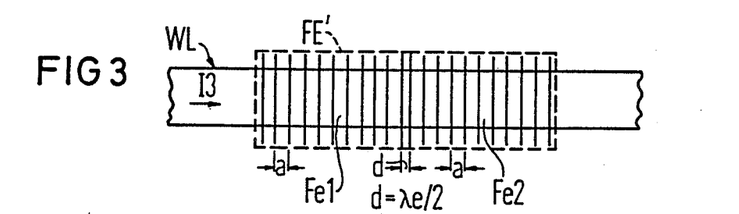
FIG. 3 is a plan view of a filter device of the invention composed of two Bragg gratings having a phase discontinuity and arranged in series.
Figure 4:
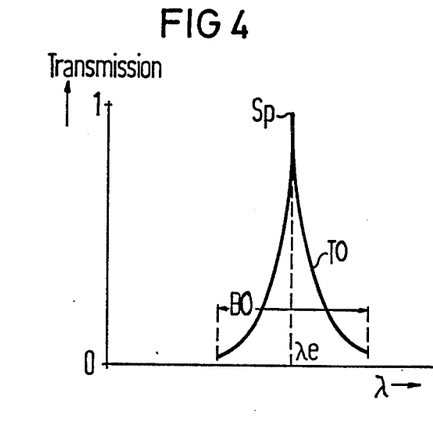
FIG. 4 is a graph showing schemmatically the transmission curve with a peak for the filter device shown in FIG. 3.

When, instead of a single Bragg grating element Fe, an arrangement consisting of two or more gratings in series is provided, then specific filter characteristics and transmission curves can be realized. Extremely exact stabilization of the emission wavelength $\lambda e$ of the semiconductor laser LD is possible in a filter device FE' as shown in FIG. 3. Two Bragg gratings Fe1 and Fe2 are arranged in series spaced apart by a distance d from one another. The distance d is referred to the optical path length of the mode conducted in the strip waveguide WL. The length D amounts to half of a wavelength of the guided optical power, or alternately to a whole multiple of this half wavelength. The two Bragg gratings Fe1 and Fe2 form what is referred to as a grating having phase shift In FIG. 4 is shown a transmission curve TO of a grating having phase shift which exhibits a transmission maximum in the form of a peak Sp which lies within a defined wavelength region BO. In the illustrated case, the operating point of the semiconductor laser LD lies at the peak Sp. Alternately, the operating wavelength $\lambda e$ of the semiconductor laser LD can lie at one of the rising or falling edges to the left or right of the pek Sp. When the stabilized operating point frequency $\lambda e$ lies at the transmission maximum, in other words at the peak Sp, and when detector devices PD1 and PD2 having high transmission values are used, then the output power of the laser LD is taken at the side at which the present arrangement is situated. In the example shown in FIG. 1, this means that the output power is taken from the strip waveguide WL at the right of the second detector device PD2. In this case, the left side of the semiconductor laser LD may be mirrored so that no optical power is emitted therefrom, but, rather, full optical power of the laser LD is emitted toward the right.

Figure 5:
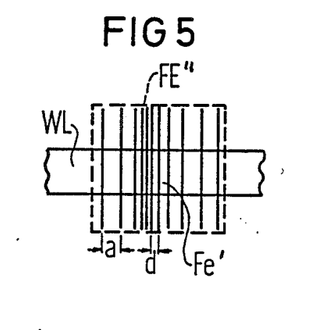
FIG. 5 is a plan view of a Bragg grating with chirp for use in the inventive arrangement.

Specific filter characteristics can also be realized using Bragg gratings having chirp. FIG. 5 shows schematically an example of a filter device FE" in plan view which is composed of a Bragg grating Fe' with chirp. Thus, the grating constant a varies, for example, according to a predetermined function. Chirp as used herein i the quality of a grating having a varying grating constant.

Figure 6:
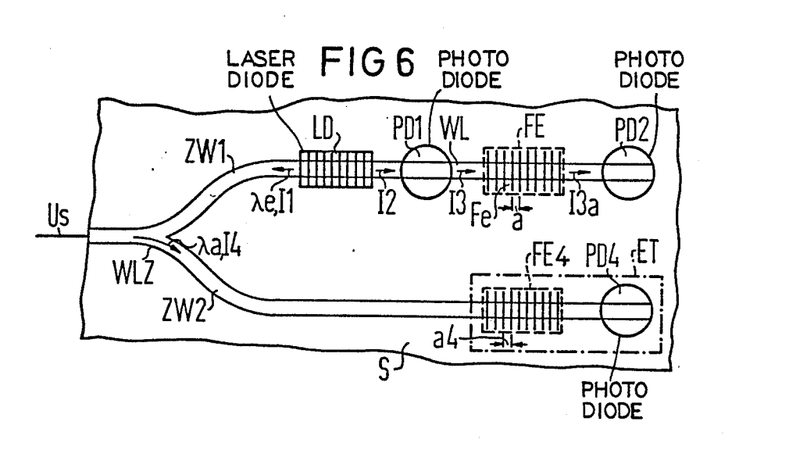
FIG. 6 is a plan view of a wavelength-division multiplex/demultiplex arrangement constructed with the arrangement of FIG. 1.

An applied example of an arrangement according to the invention is shown in FIG. 6. This example includes a bi-directional wavelength-division multiplex/demultiplex module (WDM module). Not only is the arrangement of FIG. 1 included, but also a receiver part ET is included integrated on a common substrate S. The output power I1 of the semiconductor laser LD is conducted onto a transmission path Us along a branch ZW1 of a forked strip waveguide WLZ. An optical power portion I4 is supplied from the transmission path Us, the optical power I4 having a wavelength $\lambda a$ which is different from the emission wavelength $\lambda e$ of the laser LD. The optical power I4 is supplied to the receiver part ET in a second branch ZW2 of the forked waveguide WLZ. The receiver part ET is composed of a receiver detector device PD4 and of a preceding filter device FE4 which is fashioned so it enables a wavelength $\lambda a$ of the supplied power I4 to pass therethrough but blocks the emission wavelength $\lambda e$ of the laser diode LD.

Like the filter device FE, the filter device FE4 is composed of a Bragg grating having a grating constant a4. However, the grating constant a4 is selected so that it yields a detuning between the transmission curves of the two gratings Fe and FE4 by half the stop band width such that the stabilized emission wavelength $\lambda e$ of the laser diode LD lies in the center of the stop band of the grating of the filter device FE4. A temperature drift of the two gratings Fe and Fe4 will compensate in this module when their special distance from the semiconductor laser LD is approximately the same. Aging conditions of the emission wavelength $\lambda e$ of the laser LD are likewise leveled.

LD is approximately the same. Aging conditions of the emission wavelength $\lambda e$ of the laser LD are likewise leveled.

The module disclosed in conjunction with FIG. 6 may have the same structure as a module disclosed in co-pending U.S. patent application No. 173,718, filed March 25, 1988, claiming priority of German patent application No. P37 10 549.3 filed Mar. 30, 1987. The module disclosed in the co-pending application differs from the module shown in FIG 6 in that only a single monitor detector device is provided therein instead of the two detector devices PD1 and PD2 as well as the filter device FE to the right of the semiconductor laser LD in FIG. 6. The two detector devices PD1 and PD2 of FIG. 6 can be formed like the monitor detector device therein or like the receiver detector device in the co-pending application which corresponds to the receiver detector device PD4 in FIG. 6.

Figure 7:
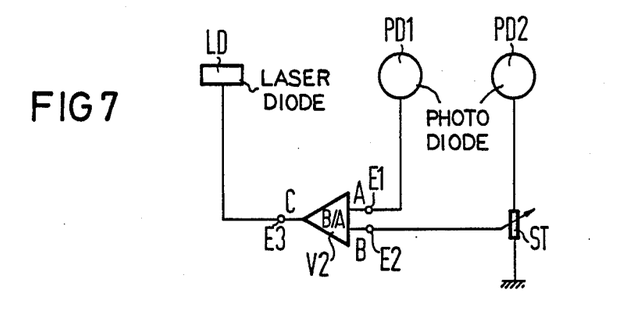
FIG. 7 is a schematic diagram of a amplifier of the control circuit of FIG. 1, including a variable voltage divider connected between one detector device and the amplifier.
Figure 8:
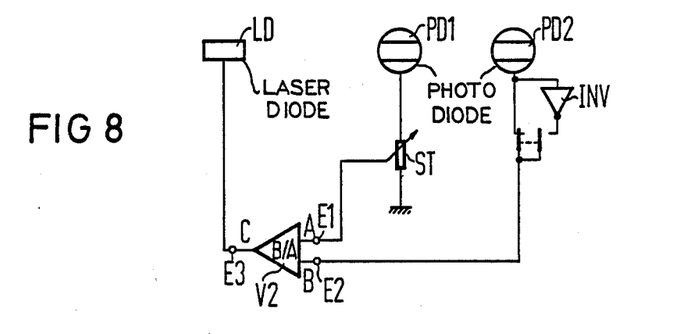
FIG. 8 is a schematic diagram of a second embodiment of the control circuit for use in FIG. 1, whereby a variable voltage divider is connected between one detector device and the amplifier. In addition, an inverter is connected between the one detector device and the amplifier.

Another possible application of the present invention that is of interest for optical frequency multiplexing and heterodyne reception is the frequency-variation of the emission wavelength $\lambda e$ of the semiconductor laser LD. By inserting a variable voltage divider SD between one of the detector devices PD1 or PD2 and the amplifier V2, the operating point and, thus, the emission wavelength e of the semiconductor laser LD can be varied. FIGS. 7 and 8 show two such circuit possibilites.

In the case of frequency variation, a greater tuning region and, thus, a flatter drop or rise of the transmission curve T of the filter device FE over the defined wavelength region Be is more beneficial then in the case of the transmission curve shown in FIG. 2. This can be achieved by a Bragg grating having a shorter length, or by a Bragg grating having chirp. The size of the tuning range is then determined by the tuning characteristic of the laser LD.

Figure 9:
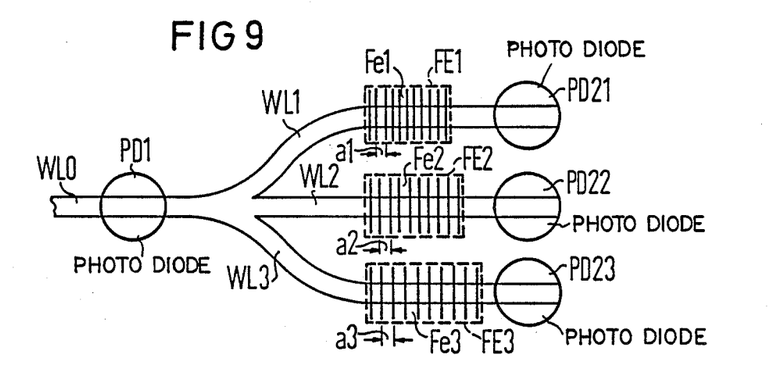
FIG. 9 is a plan view of an embodiment of the inventive arrangement including a plurality of parallel filter devices for expanding the tuning range.

The tuning range can also be enlarged when a plurality of filter devices Fe1, Fe2, and Fe3 are connected in parallel. Such an integrated optical execution of an arrangement is shown in plan view in FIG. 9. The power emitted by the semiconductor laser (not shown) is at least partially conducted to the first detector device PD1 in a strip waveguide WLO. Power emerging from the first detector device PD1 is divided onto three strip waveguides WL1, WL2 and WL3 by a triple strip waveguide branching. The filter devices FE1, FE2 and FE3 are in the form of Bragg gratings Fe1, Fe2 and Fe3 which are arranged on the three strip waveguides WL1, WL2 and WL3. The optical power which passes through the filter devices FE1, FE2 and FE3, respectively is conducted to other detector devices PD21, PD22 and PD23 in the appertaining strip waveguides WL1, WL2 and WL3. The other detector devices PD21, PD22 and PD23 are allocated to respective ones of the filter devices FE1, FE2, and FE3.

Figure 10:
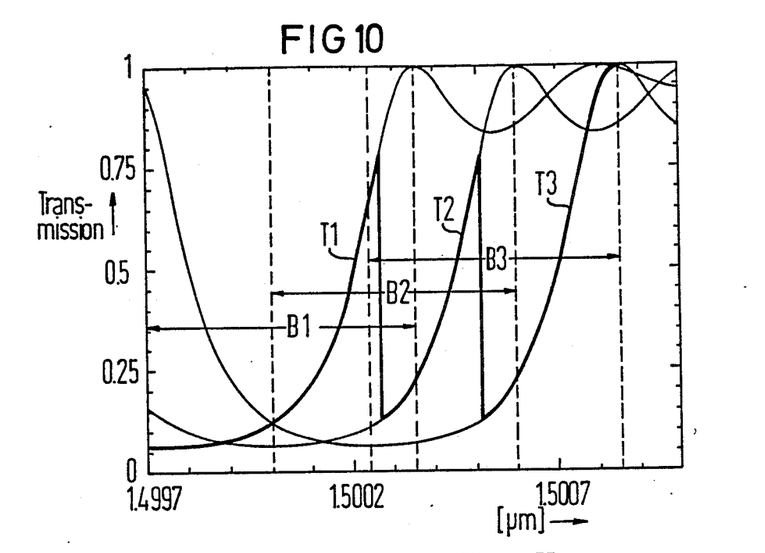
FIG. 10 is a graph showing superimposed transmission curves of the filter devices from the embodiment of FIG. 9.

The three Bragg gratings Fe1, Fe2 and Fe3 have respective grating constants a1, a2 and respectively a3 which are such that they exhibit different transmission curves T1, T2 and T3. The transmission curves T1, T2 and T3 are shown in FIG. 10 having rising or falling edges over different wavelength regions B1, B2 and B3, respectively, that follow one another or are adjacent to one another or overlap one another in a direction of increasing wavelength. Switching from one wavelength region to another can ensue in the electrical part of the arrangement via threshold switches (not shown). For example, such switching is illustrated by the heavy lined regions of the transmission curves T1, T2 and T3.

In addition to the described fine tuning, a simple rough tuning can be provided when, as shown in FIG. 8, an inverter INV is inserted between the second detector device PD2 and the amplifier V2. As a result, a rising or dropping edge of the transmission curve of the filter device of the arrangement can be changed and the emission wavelength λe can be varied by the spacing of the appertaining edges of the transmission curve in the operating point of the laser LD.

Figure 11:
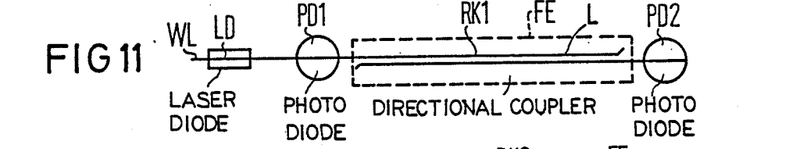
FIG. 11 is a plan view of an embodiment of the inventive arrangement including a co-directional opto-directional coupler used as a filter device.
Figure 12:
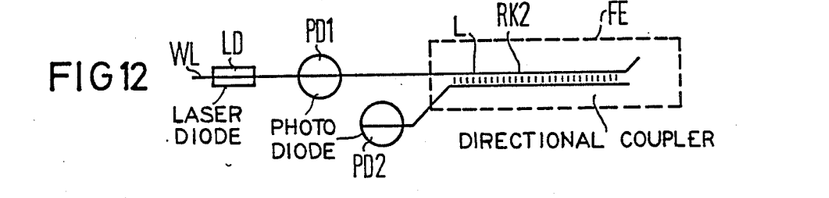
FIG. 12 is a plan view of an inventive arrangement including a contra-directional optical directional coupler used as a filter device.

In the arrangements set forth above, the filter devices are realized by Bragg gratings. However, filter devices can also be realized with some other filter means. Co-directional and contra-directional directional couplers are suitable for use in an integrated structure. In FIGS. 11 and 12 are shown arrangements having directional couplers RK1 and RK2, respectively. The directional coupler RK1 in FIG. 11 is a co-directional directional coupler wherein in-coupling is carried out at one side of a coupling path L of the directional coupler RK1 and out-coupling is carried out at the other side of the coupling path L. From FIG. 12, the directional coupler RK2 is a contra-directional directional coupler where out-coupling is carried out at the one side of the coupling path L at which end in-coupling is also carried out. Such directional couplers are known.

Figure 13:
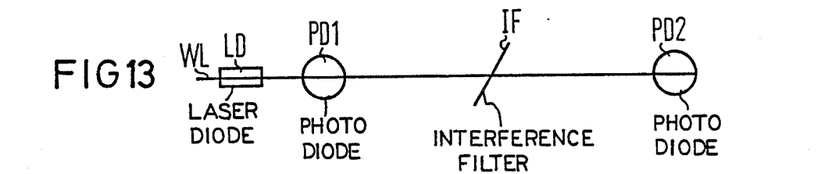
FIG. 13 is a plan view of an embodiment including an interference filter used as a filter device.

Interference filters also come into consideration for use in a hybrid structure. FIG. 13 shows an arrangement including an intereference filter IF between the detectors PD1 and PD2 in a waveguide path WL.

Thus, there has been shown and described a device for the control and regulation of laser diodes and in particular for use in integrated-optical multiplex-demultiplex modules.

Although other modifications and changes may be suggested by those skilled in the art, it is the intention of the inventors to embody within the patent warranted hereon all changes and modifications as reasonably and properly come within the scope of their contribution to the art.

We claim:

1. An arrangement for controlling or regulating an emission wavelength and emitted optical power of a semiconductor laser, comprising:
   first and second opto-electrical detector devices;
   a wavelength selective optical filter device;
   means for conducting at least part of said optical power of said semiconductor laser to said first opto-electrical detector device and said wavelength-selective optical filter device; and
   means for supplying a part of said emitted optical power to said second opto-electrical detector device, said part of said emitted optical power being reflected from or permitted to pass by said wavelength selective optical filter device.

2. An arrangement as claimed in claim 1, wherein said wavelength selective optical filter device has a transmission curve having a change over a defined wavelength region into which said emission wavelength falls.

3. An arrangement as claimed in claim 2, wherein said transmission curve of said wavelength selective optical filter device has a peak in said defined wavelength region.

4. An arrangement as claimed in claim 3, wherein said peak of said transmission curve of said wavelength selective optical filter device corresponds to at least a relative transmission maximum.

5. An arrangement as claimed in claim 1, wherein said wavelength selective optical filter device is composed of at least one optical filter element.

6. An arrangement as claimed in claim 5, wherein said at least one optical filter element is a plurality of individual optical filter elements disposed successively in a propagation direction of said optical power.

7. An arrangement as claimed in claim 6, wherein said plurality of individual optical filter elements are Bragg gratings.

8. An arrangement as claimed in claim 8, wherein at least one of said Bragg gratings have a varying grating constant.

9. An arrangement as claimed in claim 5 wherein said at least one optical filter element is a Bragg grating.

10. An arrangement as claimed in claim 7, wherein said Bragg grating has a varying grating constant. constant.

11. An arrangement as claimed in claim 5, wherein said at least one optical filter element of said wavelength selective optical filter device comprises first and second Bragg gratings disposed successively in a propagation direction of said optical power, said first and second Bragg gratings being spaced from one another by a distance substantially equaling a whole multiple of half an optical wavelength of said optical power.

12. An arrangement as claimed in claim 1, wherein said wavelength selective optical filter device is a directional coupler.

13. An arrangement as claimed in claim 12, wherein said directional coupler is a co-directional directional coupler.

14. An arrangement as claimed in claim 12, wherein said directional coupler is a contra-directional directional coupler.

15. An arrangement as claimed in claim 1, wherein said wavelength selective optical filter device is an interference filter.

16. An arrangement as claimed in claim 1, wherein said wavelength selective optical filter device is a first optical filter device, and further comprising:
   at least a second optical filter device disposed side-by-side with said first optical filter device;
   means for supplying portions of said optical power in parallel to said first and said at least second optical filter devices;
   a different one of said opto-electrical detector devices allocated to each of said first and said at least second optical filter devices; and
   means for conducting parts of said supplied portions of said optical power to said different ones of said opto-electrical detector devices, said parts of said supplied portions being reflected from or permitted to pass by allocated ones of said first and said at least second optical filter devices.

17. An arrangement as claimed in claim 16, wherein said first and said at least second optical filter devices have different transmission curves having changes in different wavelength regions that follow one another in a direction of increasing wavelength.

18. An arrangement as claimed in claim 17, wherein said different wavelength regions of said optical filter devices are at least adjacent one another.

19. An arrangement as claimed in claim 18, wherein said different wavelength regions of said optical filter devices overlap one another.

20. An arrangement as claimed in claim 1, wherein said first opto-electrical detector device is partially transmissive so that a transmitted part of said part of said optical power conducted to said first detector device by said means for conducting is passed through said first detector device; and
   second means for conducting said transmitted part to said wavelength selective optical filter device.

21. An arrangement as claimed in claim 20, wherein said semiconductor laser emits optical power to two sides, part of said optical power from one of said two sides being taken as output power, and said arrangement being connected to receive part of said optical power from a second of said two sides.

22. An arrangement as claimed in claim 22, wherein said partially transmissive detector device absorbs more than 95% of optical power conducted to it.

23. An arrangement as claimed in claim 20, wherein at least said second detector device is transmissive, and means for taking out power from said transmissive second detector device.

24. An arrangement as claimed in claim 1, wherein said semiconductor laser emits optical power to two sides, part of said optical power from one of said two sides being taken as output power, and said arrangement being connected to receive part of said optical power from a second of said two sides.

25. An arrangement as claimed in claim 1, further comprising:
   at least one optical waveguide conducting said optical power to said filter device and said detector devices.

26. An arrangement as claimed in claim 25, wherein said detector devices are photodiodes, said at least one optical waveguide is a strip waveguide, and
   said semiconductor laser and said filter device and said detector devices and said strip waveguide are integrated on a common substrate.

27. An arrangement as claimed in claim 25 wherein said at least one waveguide is a branched waveguide, and further comprising:
   a first waveguide branch of said branched waveguide connected to receive said output power from said semiconductor laser;
   a second waveguide branch of said branched waveguide conducting a second wavelength to one of said detector devices, said second wavelength differs from said emission wavelength; and
   a second filter device preceding said one detector device, said second filter device blocking said emission wavelength and passing said second wavelength.

28. An arrangement as claimed in claim 27, wherein said branched waveguide is a forked strip waveguide.

29. An arrangement as claimed in claim 1, wherein said first detector device produces a first output signal which is connected to control or regulate said emitted power of said semiconductor laser;
   said second detector device producing a second output signal; and further comprising:
   a amplifier connected to receive said first and second output signals, said amplifier providing an amplifier output signal which is proportional to a quotient of said first and second output signals, said amplifier output signal connected to control said emission wavelength of said semiconductor laser.

30. An arrangement as claimed in claim 29, further a variable voltage divider device connected between one of said first and second detector devices and said amplifier.

31. An arrangement as claimed in claim 30, further comprising:
   an inverter connectable between another one of said first and second detector devices and said amplifier.

32. An arrangement as claimed in claim 29, further comprising:
   an inverter connectable between one of said first and second detector devices and said amplifier.

* * * * *